United States Patent
Kleveland et al.

(10) Patent No.: US 7,219,271 B2
(45) Date of Patent: May 15, 2007

(54) MEMORY DEVICE AND METHOD FOR REDUNDANCY/SELF-REPAIR

(75) Inventors: Bendik Kleveland, Santa Clara, CA (US); Alper Ilkbahar, San Jose, CA (US); Roy E. Scheuerlein, Cupertino, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 270 days.

(21) Appl. No.: 10/024,646

(22) Filed: Dec. 14, 2001

(65) Prior Publication Data

US 2003/0115518 A1   Jun. 19, 2003

(51) Int. Cl.
G11C 29/00 (2006.01)
G11C 17/00 (2006.01)
(52) U.S. Cl. .................................. 714/718; 365/103
(58) Field of Classification Search ............... 714/710, 714/711, 718, 723, 42
See application file for complete search history.

(56) References Cited

U.S. PATENT DOCUMENTS

| | | |
|---|---|---|
| 4,646,266 A | 2/1987 | Ovshinsky et al. |
| 5,278,839 A * | 1/1994 | Matsumoto et al. ........ 714/710 |
| 5,313,425 A | 5/1994 | Lee et al. |
| 5,432,729 A | 7/1995 | Carson et al. |
| 5,469,450 A | 11/1995 | Cho et al. |
| 5,579,265 A | 11/1996 | Devin |
| 5,642,318 A | 6/1997 | Knaack et al. |
| 5,701,267 A | 12/1997 | Masuda et al. |
| 5,708,667 A | 1/1998 | Hayashi |
| 5,748,545 A | 5/1998 | Lee et al. |

(Continued)

FOREIGN PATENT DOCUMENTS

GB   2 265 031   9/1993

(Continued)

OTHER PUBLICATIONS

"Computer Engineering: Hardware Design," M. Morris Mano, Chapter 6-4 Error Detection and Correction, pp. 199-202 (1988).

(Continued)

*Primary Examiner*—Guy Lamarre
*Assistant Examiner*—John J. Tabone, Jr.
(74) *Attorney, Agent, or Firm*—Brinks Hofer Gilson & Lione

(57) ABSTRACT

The preferred embodiments described herein provide a memory device and method for redundancy/self-repair. In one preferred embodiment, a memory device is provided comprising a primary block of memory cells and a redundant block of memory cells. In response to an error in writing to the primary block, a flag is stored in a set of memory cells allocated to the primary block, and the redundant block is written into. In another preferred embodiment, an error in writing to a primary block is detected while an attempt is made to write to that block. In response to the error, the redundant block is written into. In yet another preferred embodiment, a memory device is provided comprising a three-dimensional memory array and redundancy circuitry. In still another preferred embodiment, a method for testing a memory array is provided. Other preferred embodiments are provided, and each of the preferred embodiments described herein can be used alone or in combination with one another.

43 Claims, 13 Drawing Sheets

U.S. PATENT DOCUMENTS

| | | | |
|---|---|---|---|
| 5,751,647 | A | 5/1998 | O'Toole |
| 5,757,700 | A | 5/1998 | Kobayashi |
| 5,784,391 | A | 7/1998 | Konigsburg |
| 5,796,694 | A | 8/1998 | Shirane |
| 5,831,989 | A * | 11/1998 | Fujisaki ............... 714/723 |
| 5,835,396 | A | 11/1998 | Zhang |
| 5,835,509 | A | 11/1998 | Sako et al. |
| 5,872,790 | A | 2/1999 | Dixon |
| 5,909,049 | A | 6/1999 | McCollum |
| 5,920,502 | A | 7/1999 | Noda et al. |
| 5,943,254 | A | 8/1999 | Bakeman, Jr. et al. |
| 5,986,950 | A | 11/1999 | Joseph ................ 365/200 |
| 6,016,269 | A | 1/2000 | Peterson et al. |
| 6,026,476 | A * | 2/2000 | Rosen ................. 711/206 |
| 6,034,882 | A * | 3/2000 | Johnson et al. ........ 365/103 |
| 6,185,122 | B1 | 2/2001 | Johnson et al. |
| 6,205,564 | B1 | 3/2001 | Kim et al. ............. 714/48 |
| 6,216,247 | B1 * | 4/2001 | Creta et al. ............ 714/763 |
| 6,236,587 | B1 | 5/2001 | Gudesen et al. |
| 6,344,755 | B1 | 2/2002 | Reddy et al. |
| 6,420,215 | B1 | 7/2002 | Knall et al. |
| 6,438,044 | B2 | 8/2002 | Fukuda ................ 365/200 |
| 6,446,242 | B1 * | 9/2002 | Lien et al. ............. 716/6 |
| 6,462,988 | B1 | 10/2002 | Harari |
| 6,498,749 | B1 | 12/2002 | Cuppens et al. |
| 6,515,923 | B1 | 2/2003 | Cleeves |
| 6,525,953 | B1 | 2/2003 | Johnson |
| 6,545,501 | B1 * | 4/2003 | Bailis et al. ........... 326/10 |
| 6,553,510 | B1 * | 4/2003 | Pekny ................. 714/6 |
| 6,567,287 | B2 | 5/2003 | Scheuerlein |
| 6,597,595 | B1 | 7/2003 | Ichiriu et al. |
| 6,658,438 | B1 | 12/2003 | Moore et al. |
| 6,661,730 | B1 | 12/2003 | Scheuerlein et al. |
| 6,728,149 | B2 | 4/2004 | Akamatsu |
| 2002/0028541 | A1 | 3/2002 | Lee et al. |
| 2002/0085431 | A1 | 7/2002 | Jeon et al. ............ 365/200 |
| 2002/0162062 | A1 | 10/2002 | Hughed et al. ......... 714/723 |
| 2003/0021176 | A1 | 1/2003 | Hogan ................ 365/230.06 |
| 2003/0115514 | A1 | 6/2003 | Ilkbahar et al. |
| 2003/0115518 | A1 | 6/2003 | Kleveland et al. |
| 2004/0255089 | A1 | 12/2004 | Unno ................. 711/154 |

FOREIGN PATENT DOCUMENTS

| | | | |
|---|---|---|---|
| WO | WO99/14763 | * | 9/1997 |
| WO | WO 99/14763 | | 3/1999 |

OTHER PUBLICATIONS

"Reed-Solomon Codes," http://www.4i2i.com/reed_solomon_codes.htm, 8 pages (1998).

"A 30 ns 64Mb DRAM with Built-in Self-Test and Repair Function," 1992 IEEE International Solid State Circuits Conference, Digest of Technical Papers, pp. 150-151 (Feb. 1992).

"64M×8 Bit NAND Flash Memory," Samsung Electronics, 40 pages (Oct. 27, 2000).

"Exotic Memories, Diverse Approaches," EDN Asia, pp. 22-33 (Sep. 2001).

"A Vertical Leap for Microchips," Thomas H. Lee, Scientific American, 8 pages (Jan. 2002; printed Dec. 10, 2001).

"Three-Dimensional Memory Array and Method of Fabrication," U.S. Appl. No. 09/560,626, filed Apr. 28, 2000; inventor: Johan Knall.

"Memory Devices and Methods for Use Therewith," U.S. Appl. No. 09/748,589, filed Dec. 22, 2000; inventors: Roger W. March, Christopher S. Moore, Daniel Brown, Thomas H. Lee, and Mark G. Johnson.

"Three-Dimensional Memory Array and Method for Storing Data Bits and ECC Bits Therein," U.S. Appl. No. 09/747,574, filed Dec. 22, 2000; inventors: Thomas H. Lee, James M. Cleeves, and Mark G. Johnson.

"Memory Device and Method for Sensing while Programming a Non-Volatile Memory Cell," U.S. Appl. No. 09/896,815, filed Jun. 29, 2001; inventors: Bendik Kleveland, James M. Cleeves, and Roy E. Scheuerlein.

"A 16Mb Mask ROM with Programmable Redundancy," Nsruka et al., ISSCC 1989/Session 10: Nonvolatile Memories/Paper THAM 10.1, 2 pages, Feb. 16, 1989.

"Circuit Technologies for 16Mb DRAMs," Mano et al., ISSCC 1987/Session I: MEGABIT DRAMs/Paper WAM 1.6, 2 pages, Feb. 27, 1987.

"Memory Device and Method for Storing and Reading Data in a Write-Once Memory Array," U.S. Appl. No. 09/877,720, filed Jun. 8, 2001; inventors: Christopher S. Moore, James E. Schneider, J. James Tringali and Roger W. March.

"Memory Device and Method for Storing and Reading a File System Structure in a Write-Once Memory Array," U.S. Appl. No. 09/877,719, filed Jun. 8, 2001; inventors: Christopher S. Moore, James E. Schneider, J. James Tringali and Roger W. March.

"Method for Reading Data in a Write-Once Memory Device Using a Write-Many File System," U.S. Appl. No. 09/818,138, filed Jun. 8, 2001; inventors: J. James Tringali, Christopher S. Moore, Roger W. March, James E. Schneider, Derek Bosch, and Daniel C. Steere.

"Method for Re-Directing Data Traffic in a Write-Once Memory Device," U.S. Appl. No. 09/877,691, filed Jun. 8, 2001; inventors: J. James Tringali, Christopher S. Moore, Roger W. March, James E. Schneider, Derek Bosch, and Daniel C. Steere.

"Method for making a Write-Once Memory Device Read Compatible with a Write-Many File System," U.S. Appl. No. 10/023,468, filed Dec. 14, 2001; inventors: Christopher S. Moore, Matt Fruin, Colm Lysaght, and Roy E. Scheuerlein.

Search History for U.S. Appl. No. 10/402,385, 3 pages, Nov. 17, 2004.

* cited by examiner

SPARE ARRAY EXTENSION

MEMORY DEVICE AND METHOD FOR REDUNDANCY/SELF-REPAIR

BACKGROUND

Volatile and non-volatile memory arrays can have yield degradations due to problems occurring during manufacture of the memory array as well as during use of the memory array in the field. To improve manufacture-related yield in some memory arrays, the memory array can be tested at the factory, and redundancy circuits in the memory device can replace faulty blocks of memory (e.g., faulty bits, bytes, columns, rows, or sub-arrays) prior to shipment. To improve field-related yield, parity checking or error-correcting code ("ECC") algorithms can be used. The use of these algorithms is particularly important for once-programmable non-volatile memories (e.g., PROM) because individual memory cells cannot be programmed, tested, and then erased prior to shipment. Commonly-used ECC algorithms can correct single-bit errors and detect (but not correct) multi-bit errors. More-powerful ECC algorithms can be used to correct multi-bit errors, but the overhead of the circuitry and extra syndrome bits associated with those more-powerful algorithms may be undesirable.

SUMMARY

The present invention is defined by the following claims, and nothing in this section should be taken as a limitation on those claims.

By way of introduction, the preferred embodiments described below provide a memory device and method for redundancy/self-repair. In one preferred embodiment, a memory device is provided comprising a primary block of memory cells and a redundant block of memory cells. In response to an error in writing to the primary block, a flag is stored in a set of memory cells allocated to the primary block, and the redundant block is written into. In another preferred embodiment, an error in writing to a primary block is detected while an attempt is made to write to that block. In response to the error, the redundant block is written into. In yet another preferred embodiment, a memory device is provided comprising a three-dimensional memory array and redundancy circuitry. In still another preferred embodiment, a method for testing a memory array is provided. Other preferred embodiments are provided, and each of the preferred embodiments described herein can be used alone or in combination with one another.

The preferred embodiments will now be described with reference to the attached drawings.

BRIEF DESCRIPTION OF THE DRAWINGS

FIG. 8 is an illustration of a page sub-register of a preferred embodiment.

FIG. 10 is an illustration of a page sub-register of a preferred embodiment that is extended to hold a section of spare array data.

DETAILED DESCRIPTION OF THE PRESENTLY PREFERRED EMBODIMENTS

By way of overview, the preferred embodiments described herein relate to redundancy/self-repair operations for a memory array. In at least some of the preferred embodiments, one or more redundant blocks of memory cells are associated with a group (or "bin") of one or more primary blocks of memory cells. If there is an error in writing to a primary block in the bin, a redundant block is used to replace that primary block. As used herein, the term "block" refers to an allocation unit of memory and can be any size ranging from a single memory cell to all of the memory cells in a memory array. A block can be, for example, a row of memory cells, a column of memory cells, a page of memory cells, or a sub-array of memory cells.

Figure 1:
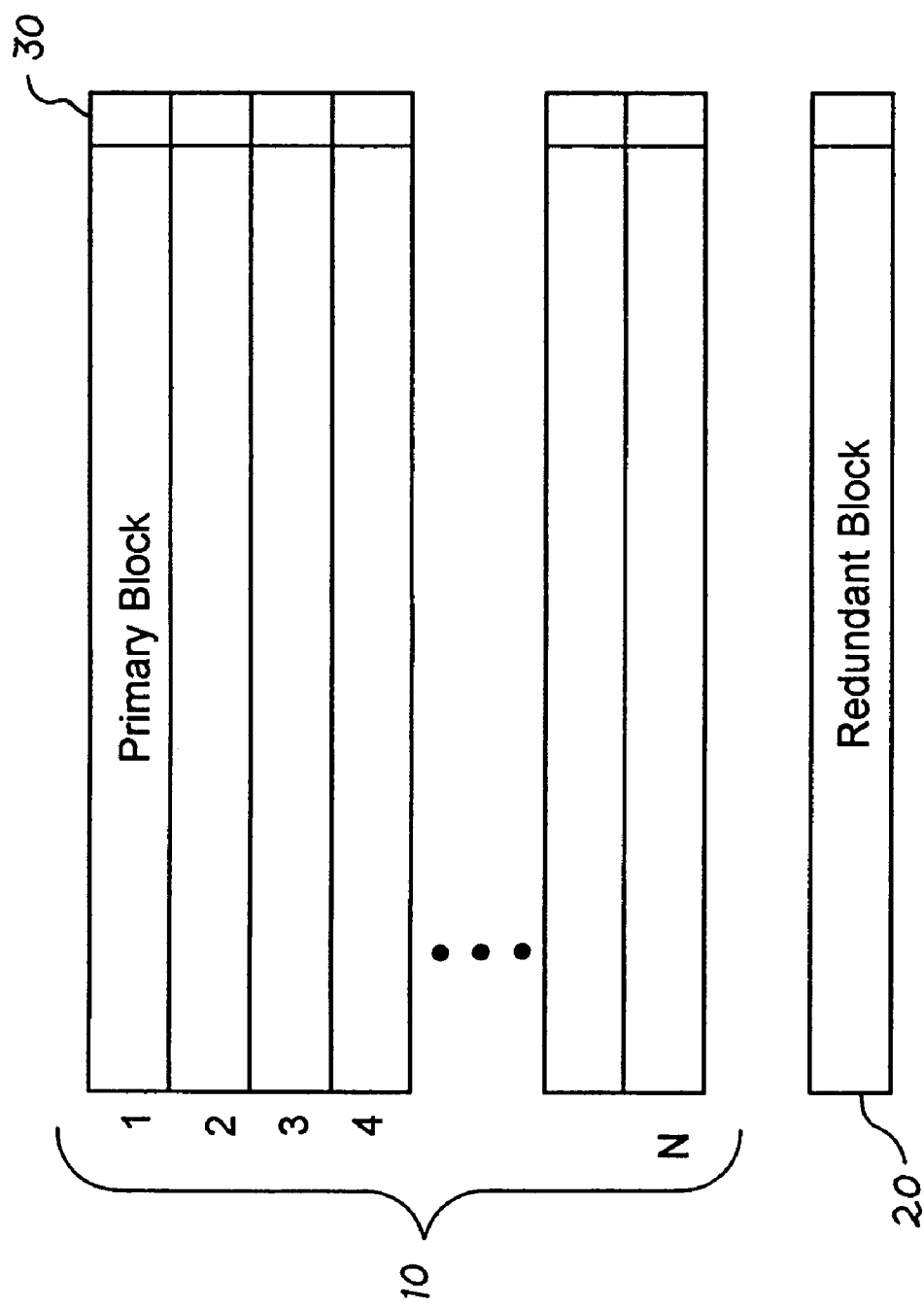
FIG. 1 is an illustration of a preferred embodiment in which a plurality of primary blocks of memory cells is associated with a single redundant block of memory cells.

In one preferred embodiment, each block has a set of memory cells allocated to it, which is used in the redundancy/self-repair operation. This embodiment will now be described in reference to FIG. 1. As shown in FIG. 1, a bin 10 of primary blocks (blocks 1-N) is associated with a single redundant block (redundant block 20), and each block has a set of memory cells 30 allocated to it. As used herein, a "set" can include one or more than one member. In operation, if there is an error in writing to a primary block, a flag is stored in the set of memory cells 30 allocated to that primary block, and the redundant block 20 is used to replace that block. During a read operation, the set of memory cells allocated to a primary block is read. If a flag is stored in the set of memory cells 30 allocated to that block (indicating that the redundant block replaced the primary block in a previous write operation), the redundant block 20 is read.

As used herein, the term "flag" broadly refers to any suitable mechanism that can be used to indicate that an error occurred in writing to a block. A flag can comprise one bit or more than one bit. Depending on the convention used, a flag can be stored by action or by omission. For example, consider the situation in which the set of memory cells 30 is a single write-once memory cell with an initial, un-programmed state of Logic 1. If Logic 0 is designated as indicating an error, the act of storing the flag comprises switching the initial state of the memory cell from Logic 1 to Logic 0. If, however, Logic 1 is designated as indicating an error, the act of storing the flag comprises allowing the state of the memory cell to remain Logic 1.

In one preferred embodiment, the primary block comprises a plurality of smaller blocks, and the error in writing to the primary block occurs when there is an error in writing at least one bit in one of the smaller blocks. In a presently preferred embodiment, a primary block is a page of 512 bytes of data bits, and the smallest-writable unit is eight bytes of data bits (an "oct-byte"). If there is an error in writing an oct-byte to the memory array, the entire page containing that oct-byte is replaced by a redundant page. Of course, the size of a block and the boundaries across which errors are detected can be varied and are likely to be driven primarily by factors such as desired design simplicity/complexity, fault coverage, and overhead. For example, designing a block to be an entire page requires relatively little overhead to store the flag. However, in the illustration set forth above, replacing an entire page if there is an error in writing an oct-byte of the page can quickly fill the redundancy areas of the memory array and, therefore, may limit the total number of faults that can be repaired. Designing a block to be an individual oct-byte can reduce this problem at the price of increased overhead since increasing the number of blocks increases the number of sets of bits needed to store flags.

An error in a primary block can be defined as any type of error. For example, an error can be defined as occurring if a bit cannot be written as intended in one or more memory cells of a block. This definition of an error may be preferred if the block is not protected by an error protection scheme. However, if the block is protected by an error protection scheme that corrects single-bit errors but does not correct double-bit errors, an error is preferably defined as occurring if bits cannot be written as intended in two memory cells. More generally, an error can be defined as occurring if bits cannot be written as intended in X memory cells, where X is sufficient to introduce an error that is uncorrectable by an error protection scheme protecting at least some of the memory cells of a block. In the presently preferred embodiment, an ECC scheme is used to correct only single-bit errors in an oct-byte. An error occurs in writing to a page (the primary block in the presently preferred embodiment) when a double-bit error occurs in writing an oct-byte of that page.

Figure 2:
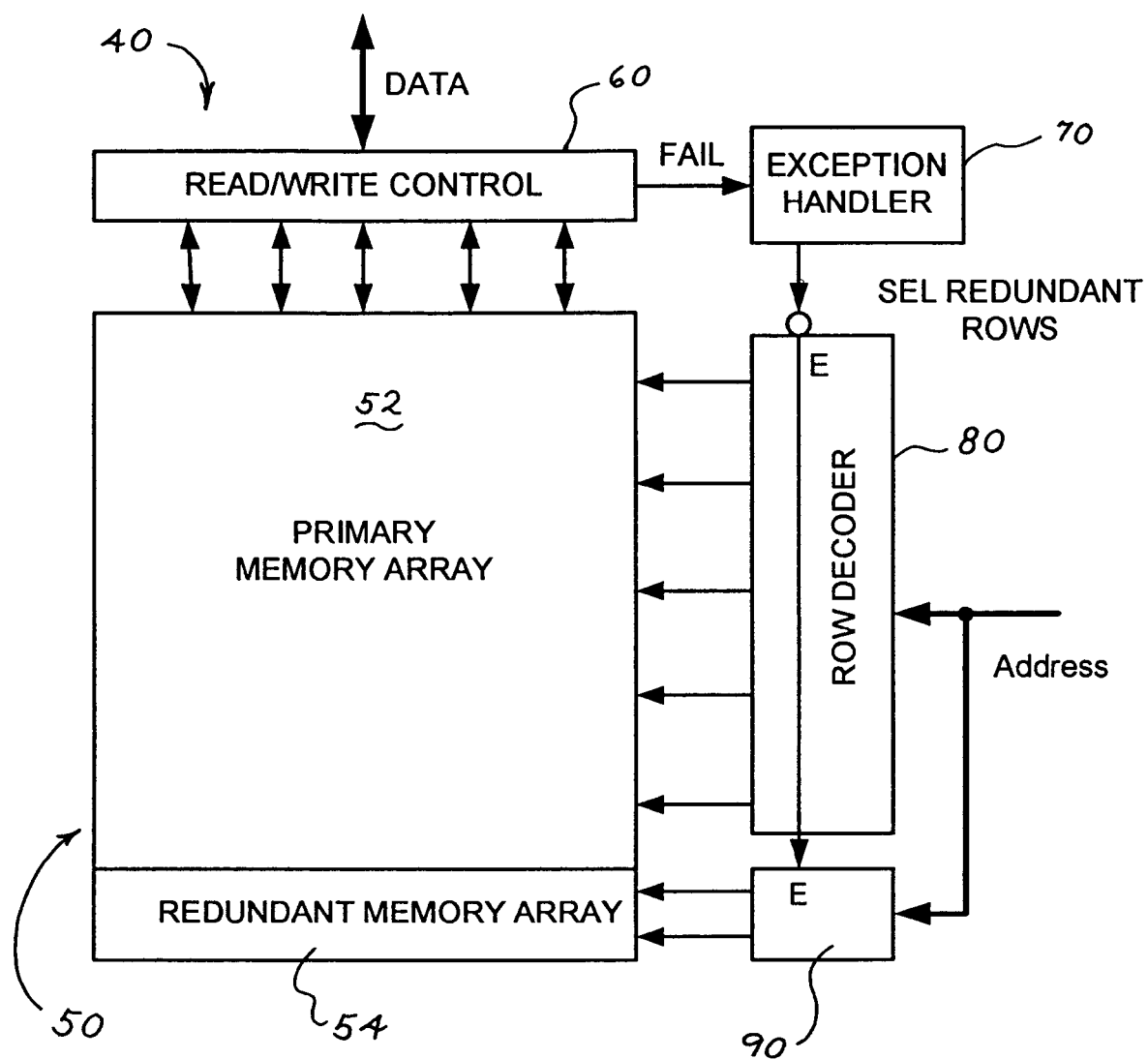
FIG. 2 is a block diagram of a memory device of a preferred embodiment.

Turning again to the drawings, FIG. 2 is an illustration of a memory device 40 of a preferred embodiment that can be used to implement the redundancy/self-repair operation described above. The memory device 40 comprises a memory array 50, which comprises a primary memory array 52 and a redundant memory array 54. The primary memory array 52 comprises primary blocks of memory cells, and the redundant memory array 54 comprises redundant blocks of memory cells. While the primary memory array 52 is shown separated from the redundant memory array 54, the primary and redundant memory arrays 52, 54 can be integrated in the memory array 50. Additionally, instead of being part of the same memory array 50, the primary and redundant memory arrays 52, 54 can be separated into two or more memory arrays. It should also be noted that a redundant block does not necessarily need to be used exclusively for redundancy. For example, a block of memory cells can be designated as a redundant block for one write operation and, if not used during that write operation, later be used as a primary block for a different write operation. Likewise, a block of memory cells can be designated as a primary block for one write operation and be used as a redundant block for another write operation. The memory device 40 also comprises read/write control 60, an exception handler 70, a row decoder 80, and a redundant row decoder 90.

In operation, the read/write control 60 attempts to write data in the primary memory array 52 at a given address. As used herein, the term "data" refers broadly to information that is to be stored in the memory array 50 and does not necessarily refer to data bits (e.g., "data" can include syndrome bits). In response to an error occurring in writing to one of the primary blocks, the read/write control 60 stores a flag in the set of memory cells allocated to that primary block and provides a "fail" signal to the exception handler 70. As used herein, an action taken "in response to" a condition can occur immediate after the occurrence of that condition or at some time after the occurrence of that condition. In response to the "fail" signal, the exception handler 70 generates a "sel redundant rows" signal, which disables the row decoder 80 and enables the redundant row decoder 90. The redundant row decoder 90 stores the mapping between the primary blocks and the redundant blocks and selects the address of the redundant block that is associated with the failed primary block. The read/write control 60 then stores the data in the redundant block specified by that redundant address.

When an error occurs in writing to a primary block, the read/write control 60 can cease writing bits to the primary block. For example, when an error occurs, the read/write control 60 can cease writing bits to the primary block, transfer all previously-written bits to the redundant block, and then write the remaining bits in the redundant block. Alternatively, the read/write control 60 can allow the write operation to proceed in the primary block. When the write operation is complete, the data is written to the redundant block. The data written to the redundant block can be read from a register providing the data to the memory array 50 or from the valid memory cells in the primary block.

When a command is received to read the failed primary block, the read/write control 60 reads the set of memory cells allocated to the failed primary block and detects that a flag is stored therein. The read/write control 60 then provides a "fail" signal to the exception handler 70, which generates a "sel redundant rows" signal to disable the row decoder 80 and enable the redundant row decoder 90. The redundant row decoder 90 selects the redundant block associated with the failed primary block, and the read/write control 60 reads the data stored in the redundant block. It should be noted that, in operation, some or all of the memory cells in the failed primary block may be read along with the set of memory cells allocated to the primary block, depending on how many memory cells are read in a given read operation and when the set of memory cells is read with respect to other memory cells in the block. To increase read bandwidth, the memory device 40 can be provided with extra sense amplifier(s) to read the set of memory cells in parallel with some or all of the memory cells in a primary block.

Figure 3:
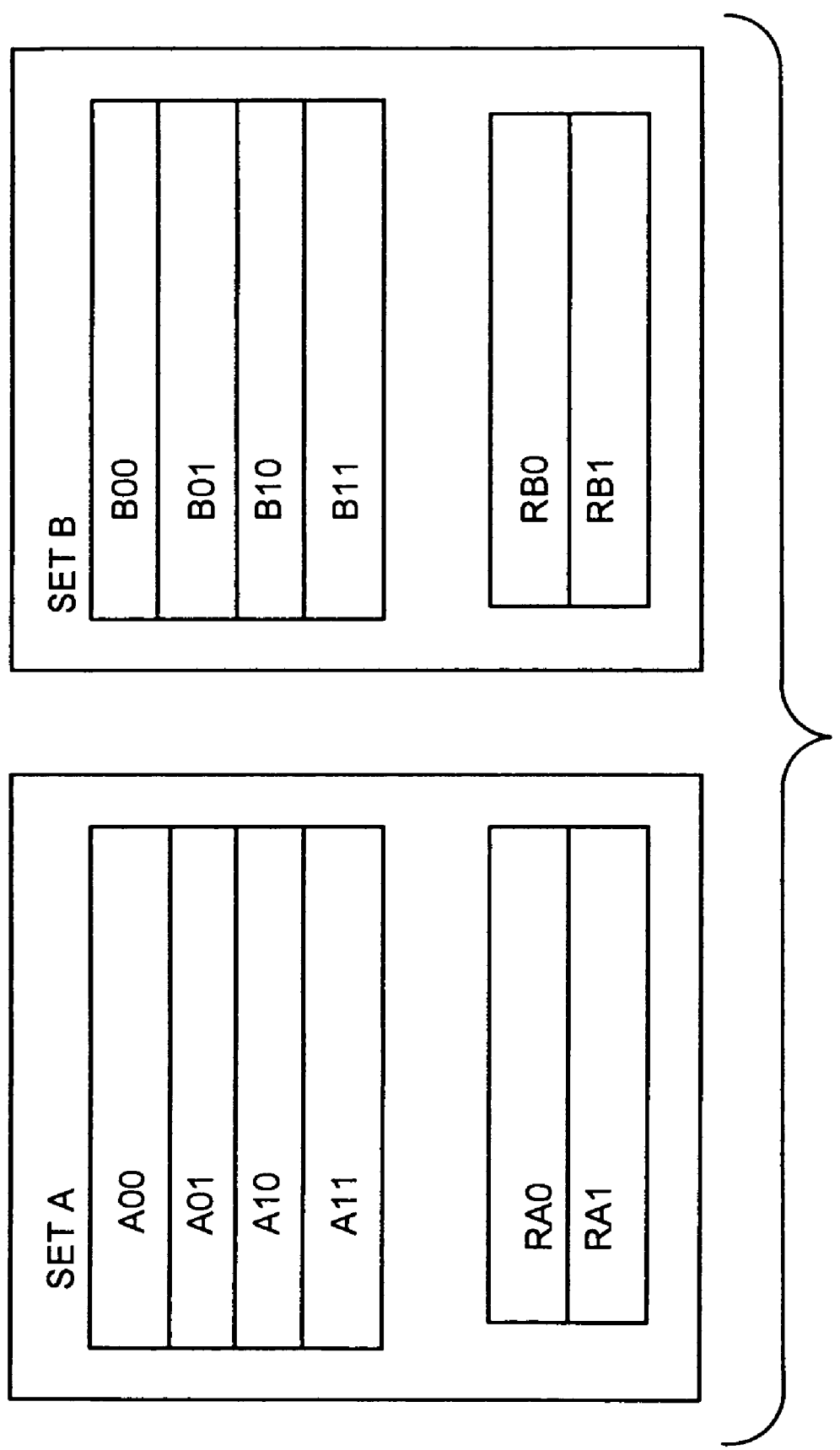
FIG. 3 is an illustration of two sets of primary and redundant blocks used to illustrate various mapping algorithms of a preferred embodiment.

As described above, the mapping between the primary blocks and the redundant blocks is stored in the redundant row decoder 90. Any suitable mapping technique can be used. For example, borrowed from cache memory terminology, direct mapping, set-associative mapping, and fully-associative mapping algorithms can be implemented. FIG. 3 is an illustration of two sets of primary and redundant blocks that will be used to illustrate those algorithms and their advantages and disadvantages. Set A comprises four primary blocks with addresses A00, A01, A10, and A11 and two redundant blocks with addresses RA0 and RA1. Set B comprises four primary blocks with addresses B00, B01, B10, and B11 and two redundant blocks with addresses RB0 and RB1. It is preferred that physically adjacent primary blocks do not map to the same redundant block in order to reduce the yield impact of large defects that may cover several blocks. In this illustration, direct mapping is used to map based on the least significant bit in an address. Here, the least significant bit of 0 (A00 and A10) maps to RA0, and the least significant bit of 1 (A01 and A11) maps to RA1. With direct mapping, if A00 is replaced by RA0, A10 cannot be replaced.

With set-associative mapping, any of the primary blocks in a given set can map to any of the available redundant blocks in that set. In this illustration, A00, A01, A10, and A11 map to RA0 or RA1, and B00, B01, B10, and B11 map to RB0 or RB1. Accordingly, if A00 is replaced by RA0, an error in A10 can be replaced by RA1. However, if an error occurs in a third primary block (e.g., A11), that primary block cannot be replaced. With fully-associative mapping, A00, A01, A10, A11, B00, B01, B10, and B11 map to RA0, RA1, RB0, or RB1. Accordingly, up to four primary blocks can be replaced with this scheme. As shown by this illustration, using a direct mapping technique minimizes circuit overhead at the risk of reduced yield, and set- and fully-associative mapping can provide higher yield at the expense of more circuit overhead.

Figure 4:
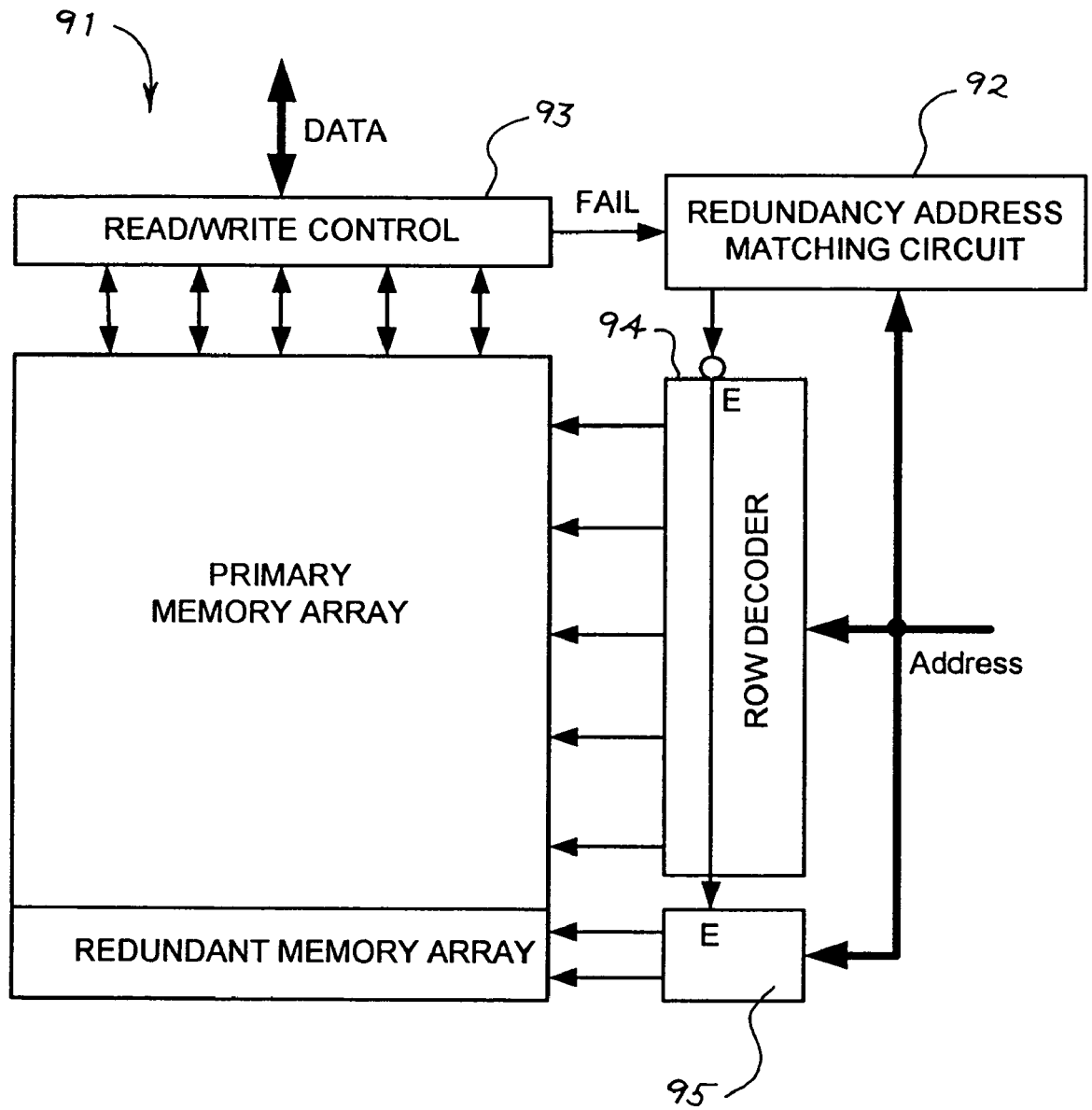
FIG. 4 is a block diagram of a memory device of another preferred embodiment in which a redundancy address matching circuit is used.

In the preferred embodiment described above, a set of memory cells allocated to a primary block was read to determine whether or not that primary block was replaced by a redundant block. If a flag is stored in the set of memory cells, the redundant block is read. In an alternate embodiment, a redundancy address matching circuitry is used instead of a set of memory cells. This alternative will be illustrated in conjunction with FIG. 4, which is a block diagram of a memory device 91 that uses a redundancy address matching circuit 92. In operation, if an error occurs in writing to one of the primary blocks, the read/write control 93 provides a "fail" signal to the redundancy address matching circuit 92. In response to the fail signal, the redundancy address matching circuit 92 generates a signal to disable the row decoder 94 and enable the redundant row decoder 95 to store the data in the redundant block. The redundancy address matching circuit 92 also stores the address of the failed primary block. When that address is later provided to the memory device 91 during a read operation, the redundancy address matching circuit 92 recognizes the address and disables the row decoder 94 and enables the redundant row decoder 95 so that data stored in the redundant block will be read.

In the embodiments described above, one or more components in the memory device were used to provide redundancy/self-repair functionality. In an alternative embodiment, instead of having "on-chip" support for redundancy/self-repair, a host device in communication with the memory device is responsible for redundancy operations. For example, when an error occurs in writing a primary block, the error can be reported to the host device, and hardware and/or software in the host device can direct write and read operations to the appropriate redundant block. The host device can store mapping information in the memory array, so that when then memory device is used with a different host device, that different host device will have the information necessary to direct write and read operations.

The error in writing to a primary block in any of these preferred embodiments can be detected in any suitable manner. For example, after one or more attempts have been made to program a memory cell, a read operation can be performed on the memory cell to determine if the memory cell is in the programmed state (e.g., Logic 0 instead of Logic 1). If the memory cell is not in the programmed state (indicating that the memory cell cannot be programmed), an error occurred in writing to that memory cell. As another example, instead of using a separate read operation to determine if the memory cell is in the programmed state, the programmed state of the memory cell can be sensed while attempting to program the memory cell. This sensing-while-programming technique is described in detail in "Memory Device and Method for Sensing while Programming a Non-Volatile Memory Cell," U.S. patent application Ser. No. 09/896,815, which is assigned to the assignee of the present application and is hereby incorporated by reference. As described in that application, the sensing-while-programming technique senses the condition of a memory cell during the write operation to that memory cell. Unlike approaches that use a series of write and read pulses to determine whether a memory cell is in a programmed state, the sensing-while-programming technique senses the programmed state of the memory cell while the programming pulse is being applied to a wordline. Accordingly, as bits in a block are written in parallel or one-by-one, the success of the programming attempt is continuously monitored. Because the wordline as well as the unselected bitline are kept at a high voltage during sensing, there is no overhead in switching to read voltage conditions, as is encountered in other approaches.

Figure 5:
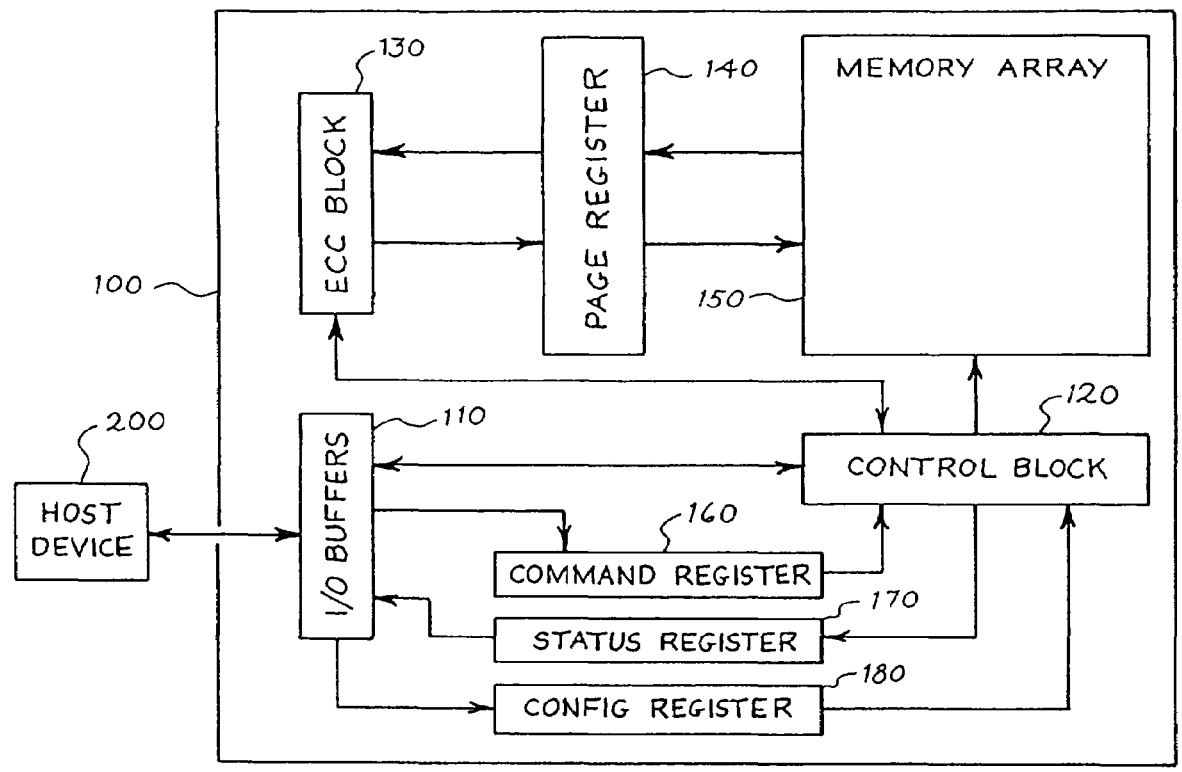
FIG. 5 is a block diagram of a memory device coupled with a host device of a preferred embodiment.

Returning to the drawings, FIG. 5 shows a memory device 100 of a preferred embodiment coupled with a host device 200. As used herein, the term "coupled with" means directly coupled with or indirectly coupled with through one or more named or unnamed components. As shown in FIG. 5, the memory device 100 comprises I/O buffers 110, a control block 120, an ECC block 130, a page register 140, a memory array 150, a command register 160, a status register 170, and a configuration register 180. The command register 160 passes commands (e.g., read, write) received from the host device 200 to the control block 120, the status register 170 holds information from the control block 120 regarding the status of certain operations (e.g., a failure during a write operation), and the configuration register 180 can be used during a test operation to instruct the control block 120 to disable ECC syndrome bit generation.

The page register 140 is a buffer structure between the memory array 150 and a Smart Media Interface (SMI) in communication with the host device 200. Bits are read from and stored in the memory array 150 a page-at-a-time, and the page register 140 holds a page of memory that is going to be stored in the memory array 150. The page register 140 also holds a page of memory that is read from the memory array 150. In this preferred embodiment, a page of memory comprises 512 bytes of main data and 64 bytes of ECC syndrome bits for that data. During a write operation, 512 bytes of data and 64 bytes of ECC syndrome bits are assembled in the page register 140 before being written into the memory array 150. In operation, the I/O buffers 110 temporarily store the incoming bytes and pass them to the control block 120. The control block 120 comprises a register that can hold eight bytes of data (an "oct-byte"). When eight bytes are stored, the oct-byte is sent from the oct-byte register to the ECC block 130, which generates a byte of ECC syndrome bits for the oct-byte. The oct-byte and its ECC syndrome byte (together, the ECC word) are then stored in the page register 140. (As used herein, the term "ECC word" refers to a string of bits, some of which are data bits and others of which are ECC syndrome bits generated from the data bits.) The page register 140 is populated one oct-byte at a time until it is full (i.e., until 64 ECC words are stored in the page register 140). The contents of the page register 140 are then transferred to the memory array 150 one byte at a time. (Partial page writes, where the contents of the page register 140 are transferred to the memory array 150 before the page register 140 is completely full, can also be implemented.) During a read operation, 512 bytes of main data and 64 bytes of ECC syndrome bits are read from the memory array 150 into the page register 140 and are then serially pushed out from the SMI to the host device 200.

Figure 6:
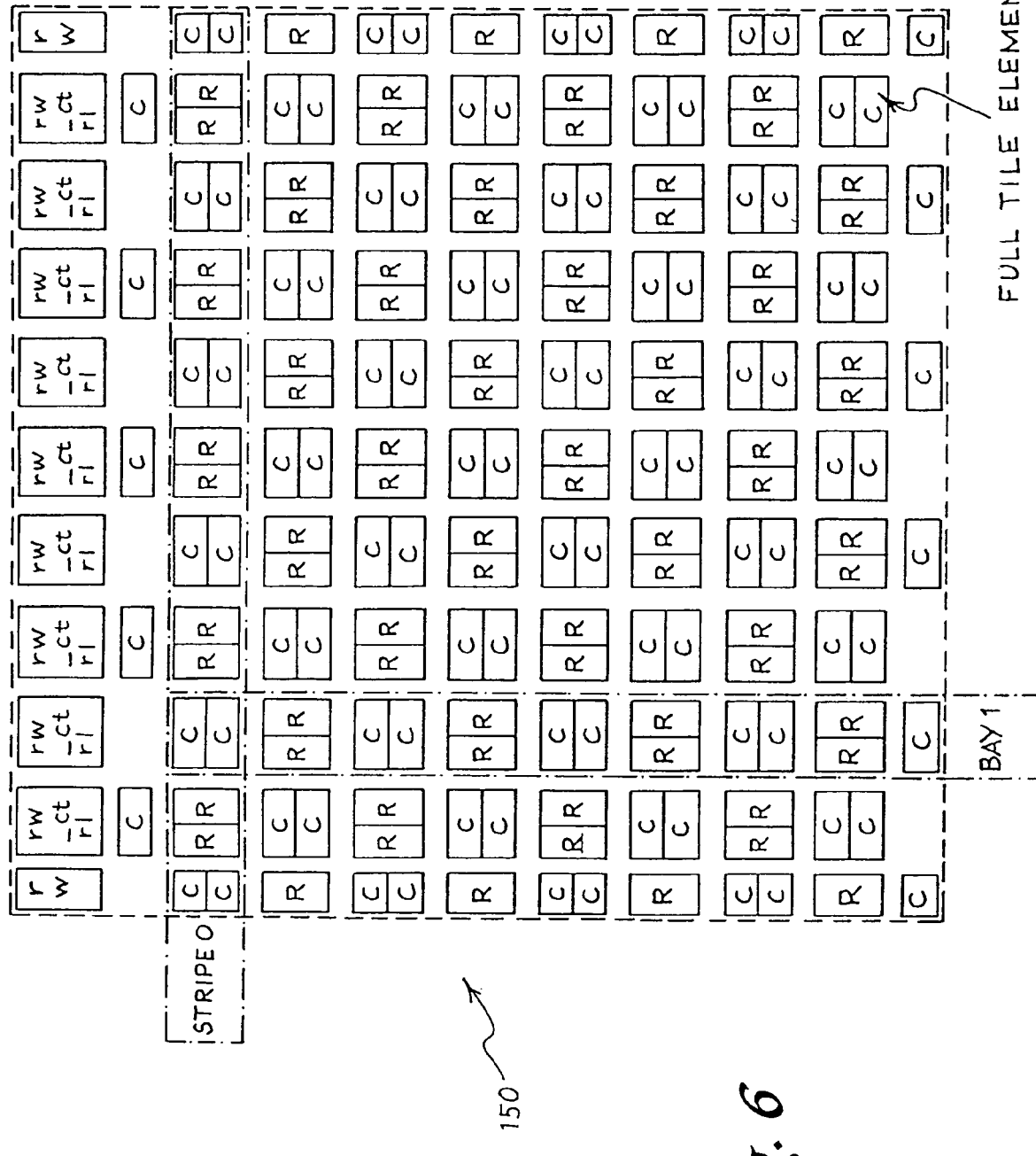
FIG. 6 is an illustration of a memory array of the memory device of FIG. 5.

Returning to the drawings, FIG. 6 is an illustration of the memory array 150. The memory array 150 comprises 88 sub-arrays (or "tiles"). As used herein, the term sub-array refers to a contiguous group of memory cells having contiguous word and bit lines generally unbroken by decoders, drivers, sense amplifiers, and input/output circuits. The core of the memory array 150 is 72 full tile elements organized in an array of eight rows (which will be referred to herein as "stripes") and nine columns (which will be referred to herein as "bays"). In this preferred embodiment, the silicon real estate under the sub-arrays is used for non-memory logic circuits, such as row and column decoders. As shown in FIG. 6, the row and column decoders, which are designated by "R"s and "C"s, respectively, are arranged under the memory array 150 in a checkerboard style to provide for a high density layout. More details on this arrangement can be found in "Memory Device with Row and Column Decoder Circuits Arranged in a Checkerboard Pattern under a Plurality of Memory Arrays," U.S. patent application Ser. No. 09/896,814, which is assigned to the assignee of the present invention and is hereby incorporated by reference.

Each sub-array comprises 1024 rows and 1024 columns in eight layers. This structure comprises the primary blocks of memory cells and provides a main 1 MB storage element. Accordingly, the memory array 150 can store 64 MB of main data and 8 MB of syndrome bits for that data. Each sub-array also comprises eight additional rows for redundancy (in each layer). These additional rows comprise the redundant blocks of memory cells. Further, each sub-array also comprises eight rows and four columns of test memory, half along each side of the sub-array, which contain sacrificial test bits. Alongside the 72 full sub-array elements, there are 16 smaller sub-arrays positioned in the columns along the two outer edges of the core array. The smaller sub-arrays are about ¼ the size of the full sub-arrays. Two sub-arrays on the same stripe are logically merged into a single element with 1024 rows and 512 columns. These smaller sub-arrays will be referred to herein as "spare arrays." The spare arrays are used to store sideband data, ECC bits for the sideband data, and data used for redundancy/self repair, all of which will be referred to herein as "spare data" (as compared to main data). The memory array 150 in this preferred embodiment is byte addressable.

In this preferred embodiment, a memory page comprises 512 bytes of main data, 64 bytes of ECC syndrome bits for the main data, 16 bytes of spare data, two bytes of ECC syndrome bits for the spare data, and 18 bytes of redundancy/self repair and extra data. The main data and the main ECC are mapped into the nine main sub-arrays in a stripe, and the remaining information is mapped into the two minor sub-arrays in the stripe. Preferably, bays 0–3 and 5–8 store the 512 bytes of main data, bay 4 stores the ECC bits for the main data, and bay 9 stores the spare data.

Figure 7:
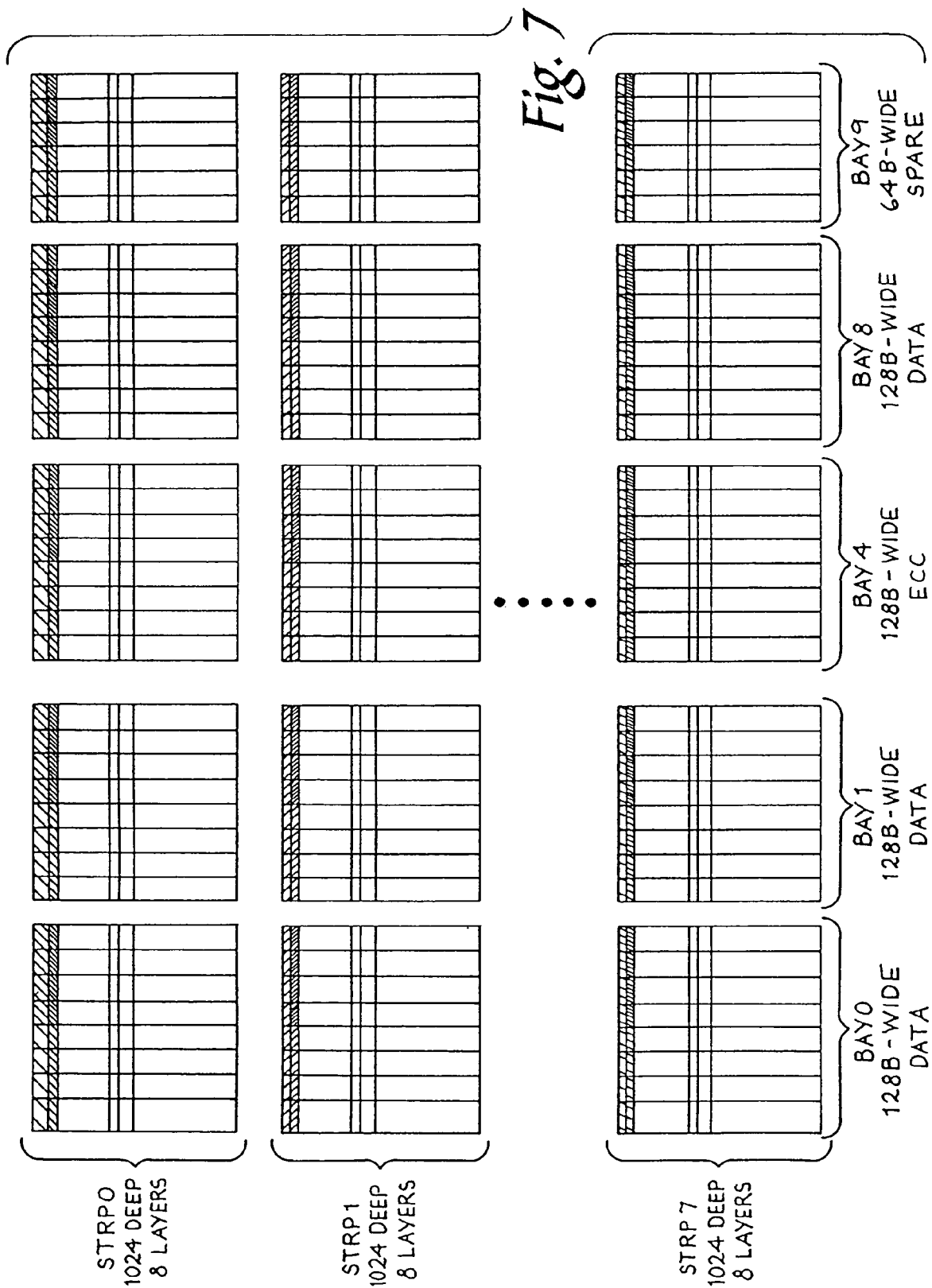
FIG. 7 is an illustration of a memory array of a preferred embodiment in which a page of memory is distributed among bays in a stripe.

In this preferred embodiment, the main data and ECC of a page are distributed among the nine sub-arrays in a stripe such that one sub-array in a stripe holds $1/9^{th}$ of the page. (The spare arrays will be discussed in more detail below.) FIG. 7 illustrates this arrangement, with different shadings used to depict different pages stored in the nine bays of each stripe. For example, for ECC word "A," bits A0–A7 would be stored in stripe 0, bay 0; bits A8–A15 would be stored in stripe 0, bay 1; etc. Likewise, for ECC word "B", bits B0–B7 would be stored in stripe 0, bay 0; bits B8–B15 would be stored in stripe 0, bay 1; etc. As shown by the shadings in FIG. 7, in this preferred embodiment, bits of a given page are located in the same location in each of the sub-arrays. To distribute a page of memory to the nine bays in a stripe, the page register 140 is preferably divided into nine identical blocks (or "sub-registers"), each of which contains page data for one of the nine sub-arrays in a stripe (i.e., $b/1;9^{th}$ of the page). (As described below, each sub-register can also contain page data for $1/9^{th}$ of what belongs to the spare array.) The read/write controllers ("rw_ctrl") on the top of each bay act as an interface between the sub-registers and the bays.

Figures 8, 10:
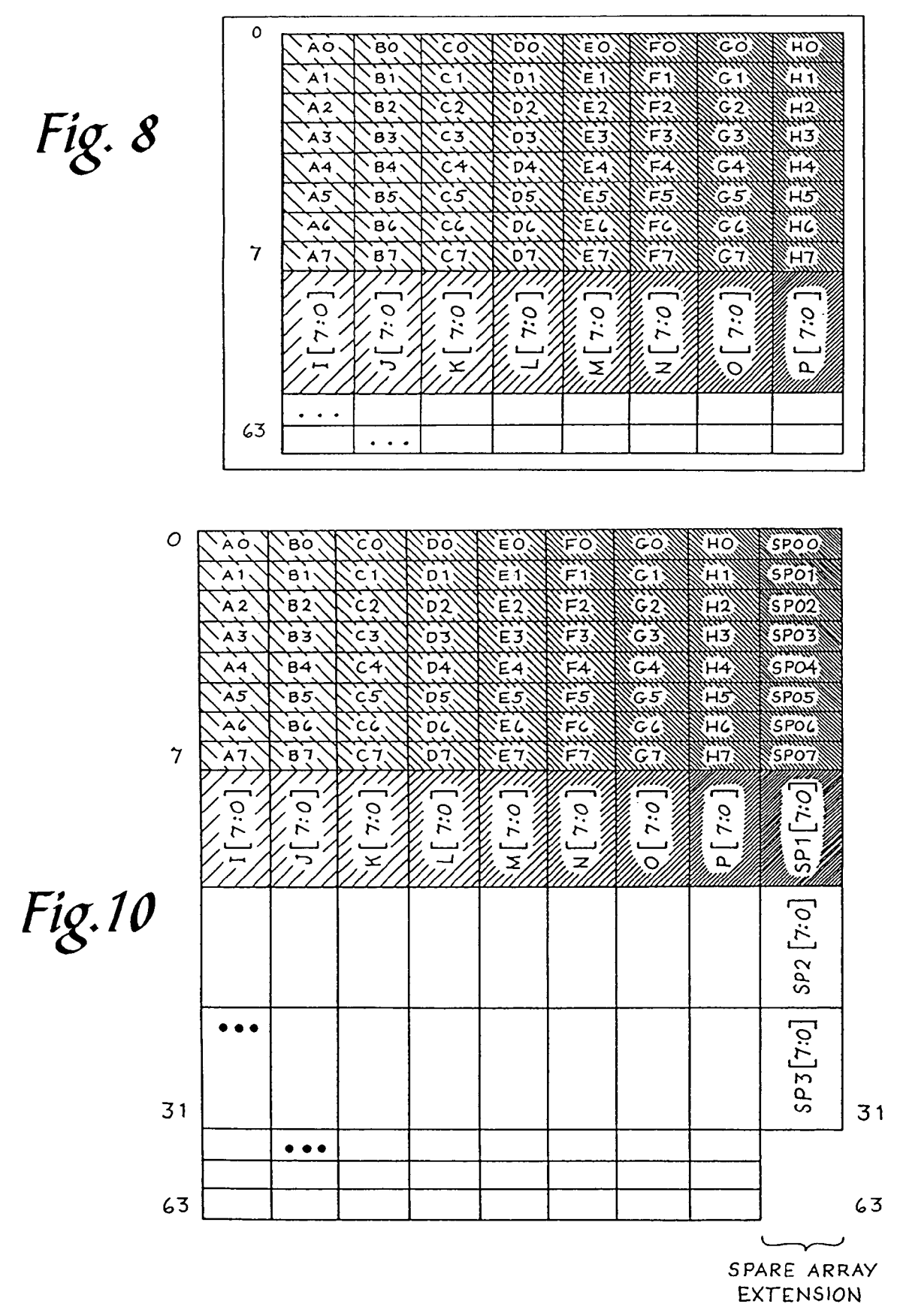
Figure 9:
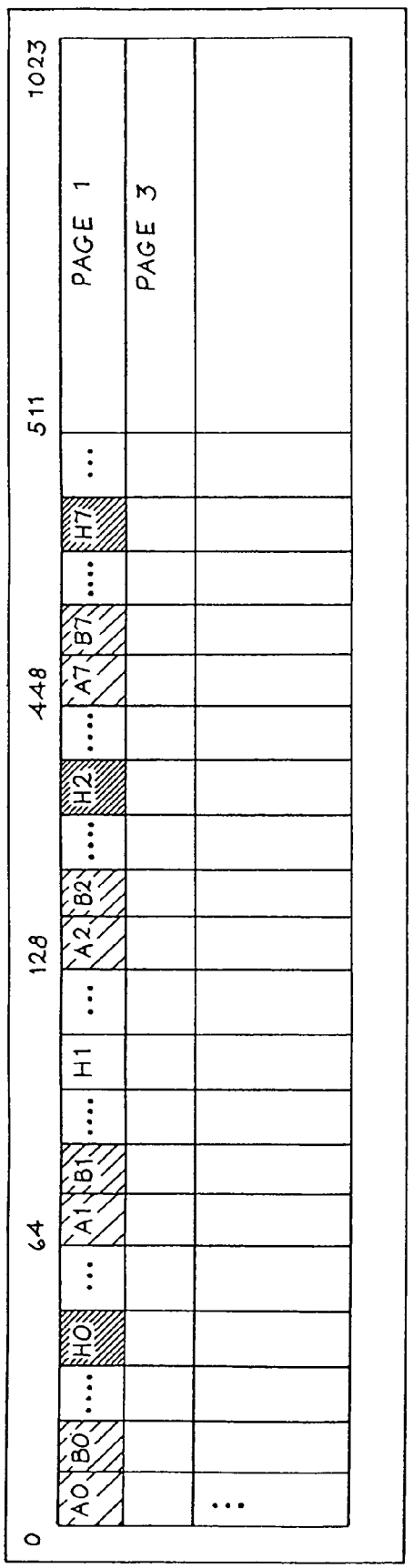
FIG. 9 is an illustration of a sub-array of a preferred embodiment.

The page register 140 in this preferred embodiment incorporates bit sprinkling functionality to maximize the physical spacing between bits in a given oct-byte and, accordingly, to improve the effectiveness of the ECC protection. Further details on the bit sprinkling functionality can be found in "Memory Device and Method for Storing Bits in Non-Adjacent Storage Locations in a Memory Array," U.S. patent application Ser. No. 10/024,647, which is assigned to the assignee of the present application and is hereby incorporated by reference. While control logic is responsible for physically mapping a page into the memory array 150, data scrambling and de-scrambling in the sub-registers is enabled as a hardware feature of the page register 140 and is transparent to the control logic. Further, the SMI logic will see the data in its original form at all times. FIG. 8 is an illustration of the page sub-register for bay 0. One byte of each word in the page is stored in the page sub-register from top to bottom. For example, bits A0–A7 of ECC word A are stored in rows 0–7 of the first column, bits B0–B7 of ECC word B are stored in rows 0–7 of the second column, etc. When bits are read out of the page sub-register and into a corresponding sub-array, the bits are read from left to right (e.g., A0 B0 C0 . . . H0). The bits read from the page sub-register are then stored in the corresponding sub-array, as illustrated in FIG. 9. (Addressing of the columns is taken care of by the column decoders in the array.) As shown in FIG. 9, because the direction that the bits were stored in the page sub-register is different from the direction that the bits were read out of the page sub-register, bits in an ECC word are located in non-adjacent locations in the memory array. Specifically, each bit is 64 storage locations apart in the sub-array (e.g., A0 is 64 storage locations apart from A1), thereby achieving maximum separation between bits of an oct-byte. Accordingly, a local manufacturing defect must be large enough to extend across 65 bit locations before causing a double-bit error within an ECC word. A defect that extends across 64 bits locations will only result in a correctable single-bit error in 64 ECC words, instead of an uncorrectable multi-bit error in a single ECC word. This enhances the yield and reliability of the memory device 100 with a minimal amount of overhead and implementation cost. The same principles described above apply to storage of the ECC syndrome bits in the sub-array in bay 4.

Figure 11:
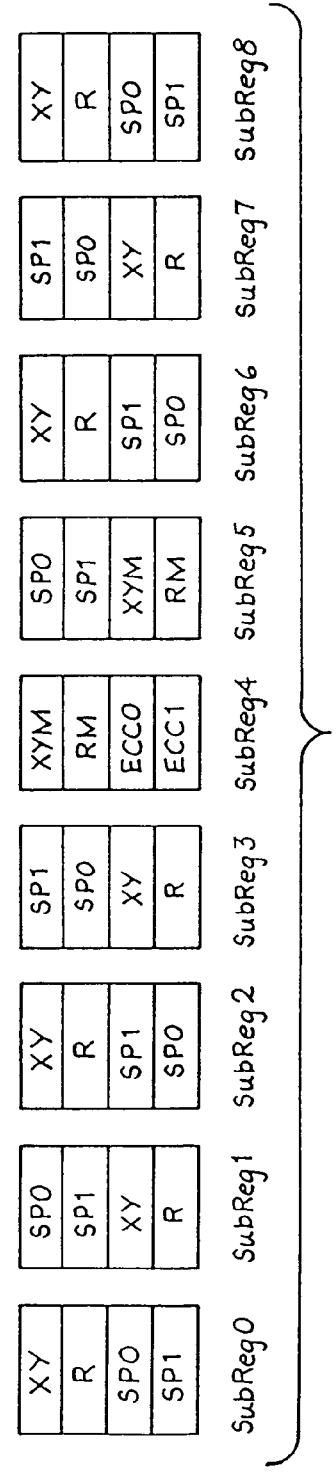
FIG. 11 is an illustration showing the location of spare array data in the extended sections of nine sub-registers of a preferred embodiment.

As discussed above, the spare array in Bay 9 is physically made up of two ¼-sized sub-arrays that logically act as a single array of 1024 rows and 512 columns (excluding redundancy and sacrificial test areas). To enable maximum separation between bits of an oct-byte in the spare array, bits are sprinkled within the page register 140. To simplify the interface between the page register 140 and the control logic, each page sub-register preferably is extended to hold a section of the spare array data as shown in FIG. 10. The addition extends the sub-register by another bit (from eight to nine) for half of its height. As the page register 140 is made of nine sub-registers, the spare array data will be contained within the extended sections of these sub-registers as shown in FIG. 11. In FIG. 11, each block represents one byte of data (one bit wide and eight bits deep). SP0 and SP1 are the spare array data (16-bytes) and ECC0 and ECC1 are their respective ECC syndrome bits. XY is used to store redundancy/self-repair data. R is a reserved area, which can be used to store dynamic bit inversion information, as described in "Memory Device and Method for Dynamic Bit Inversion," U.S. patent application Ser. No. 10/023,466, which is assigned to the assignee of the present application and is hereby incorporated by reference. XYM and RM are masked bit locations in XY and R space.

Each row in FIG. 11 represents data as it will be written to the memory array 150. This scheme maximizes spacing between data bits from the same oct-byte to four bits. However, the actual spacing achieved in the memory array 150 is significantly higher as data is written into the array 150 in groups of four with a large spacing introduced in between. This will give much of the intended result of bit sprinkling. Data scrambling and de-scrambling in the sub-registers for the spare array is enabled as a hardware feature of the page register 140 and is transparent to the control circuitry. The SMI logic will see the data in its original format at all times. It is apparent that with this scheme, in every cycle, the page register 140 would provide a nine bit output to the spare memory array. In order to utilize the existing array architecture based on eight-bit R/W circuits, the RW_CTRL circuit servicing the spare array tiles preferably steps down the incoming data stream from nine bits to eight bits by multiplexing the inputs from SubReg4 and SubReg5 such that bits tagged as XYM and RM are omitted. Preferably, these bit locations are masked out by the SMI Logic so they can be ignored without causing any functionality problems.

The memory device 100 of this preferred embodiment comprises a redundancy/self-repair mechanism that improves reliability by identifying bad pages during write or test operations, marking the bad pages as faulty, and then placing the contents of the bad pages in another location. As mentioned above, the XY locations in the spare arrays are used to store redundancy/self repair data. The XY location comprises two different locations (an XX location and a YY location), which provide an indication about the repair status of each page. While locations XX and YY can be implemented as single bits, it is preferred that those locations use multiple bits to provide protection against faults. It is also preferred that the bits be stored in physically different tile elements. In one embodiment, some of the multiple bits of XX and YY are stored in one half array and the remaining bits are stored in the other half array. As the two half arrays are physically far apart, the probability of both locations being hit by a fault is relatively low. An error detection and correction scheme (such as quadruple redundancy) can also be implemented to further improve the reliability of these locations. It is preferred that the redundancy/self repair data in locations XX and YY be placed in the first columns of the spare arrays so that faults can be identified within the first cycle of a read operation without having to wait for an entire page to transfer. The read and write operations used in conjunction with the redundancy/self-repair mechanism will now be described with reference to the flow charts of FIGS. 12–14.

Figure 12:
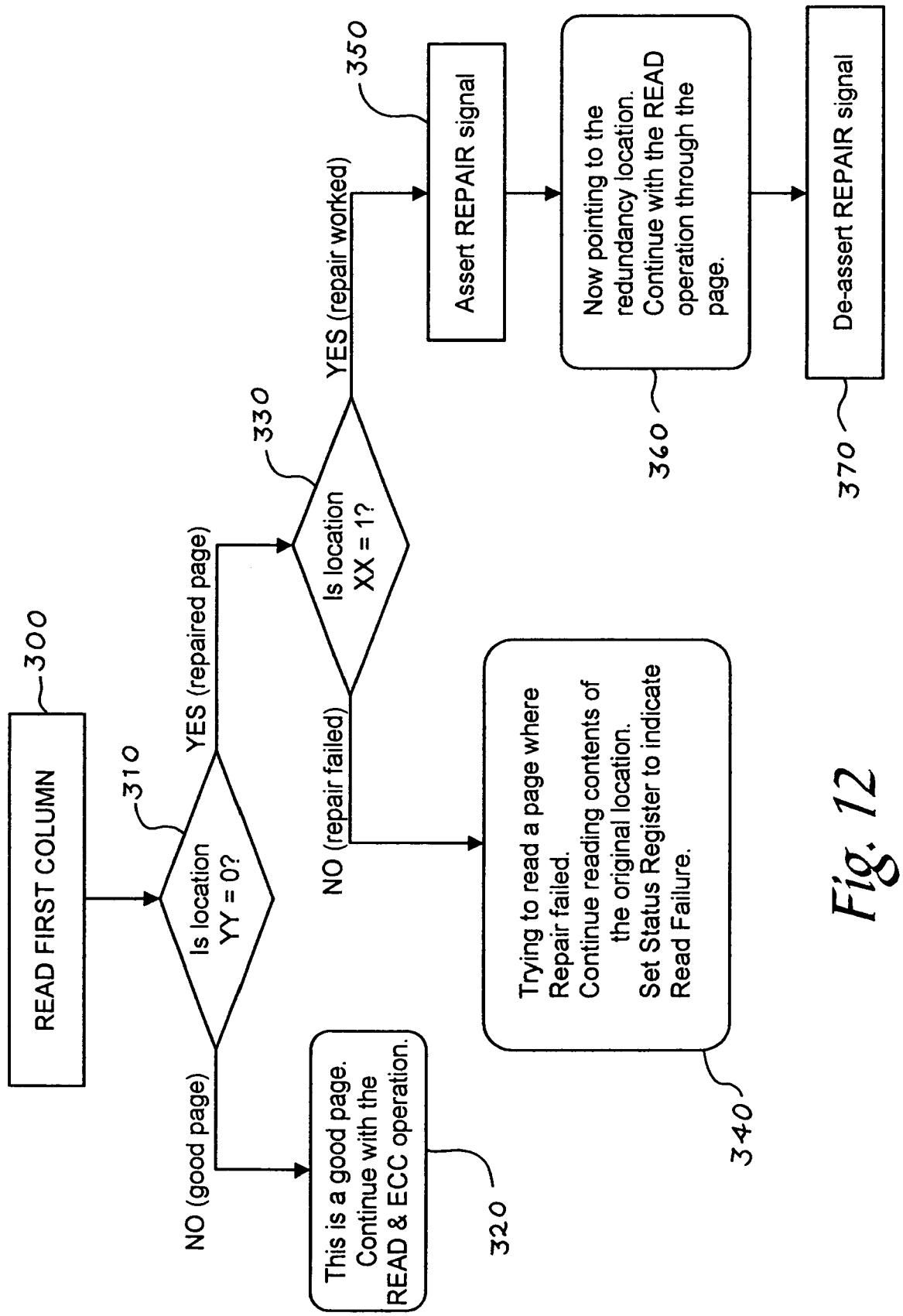
FIG. 12 is a flow chart illustrating a read operation of a preferred embodiment.

FIG. 12 is a flowchart illustrating acts of a read operation that relate to the redundancy/self-repair mechanism. At the start of a read operation, the first column in the spare array of the primary block (location YY) is read (act 300). Next, the memory device 100 determines whether location YY is programmed (act 310). As described below, location YY is programmed if an error occurred during a write operation. Accordingly, if location YY is not programmed, the read and ECC operations continue as normal since there is no indication that the page is known to be bad (act 320). However, location YY being programmed indicates that an earlier write operation in the page failed. In this situation, location XX in the primary block is read to determine whether that location is programmed (act 330). As described below, location XX is programmed if an attempted repair was reported to be a failure. If location XX is programmed, the memory device 100 is trying to read a page where a repair failed. In that situation, the contents of the original location are read, and the status register 170 is set to indicate a read failure (act 340). However, if location XX is un-programmed (indicating a successful repair), a repair signal is asserted (act 350). The repair signal initiates a repair cycle by causing the row decoders to point to a redundancy row in the memory array 150 instead of a main row. With the row decoders pointing to the redundancy location, the memory device 100 continues with the read operation, reading data of the page from the redundancy section of the array (act 360). When the read operation is completed, the repair signal is de-asserted (act 370).

Figure 13:
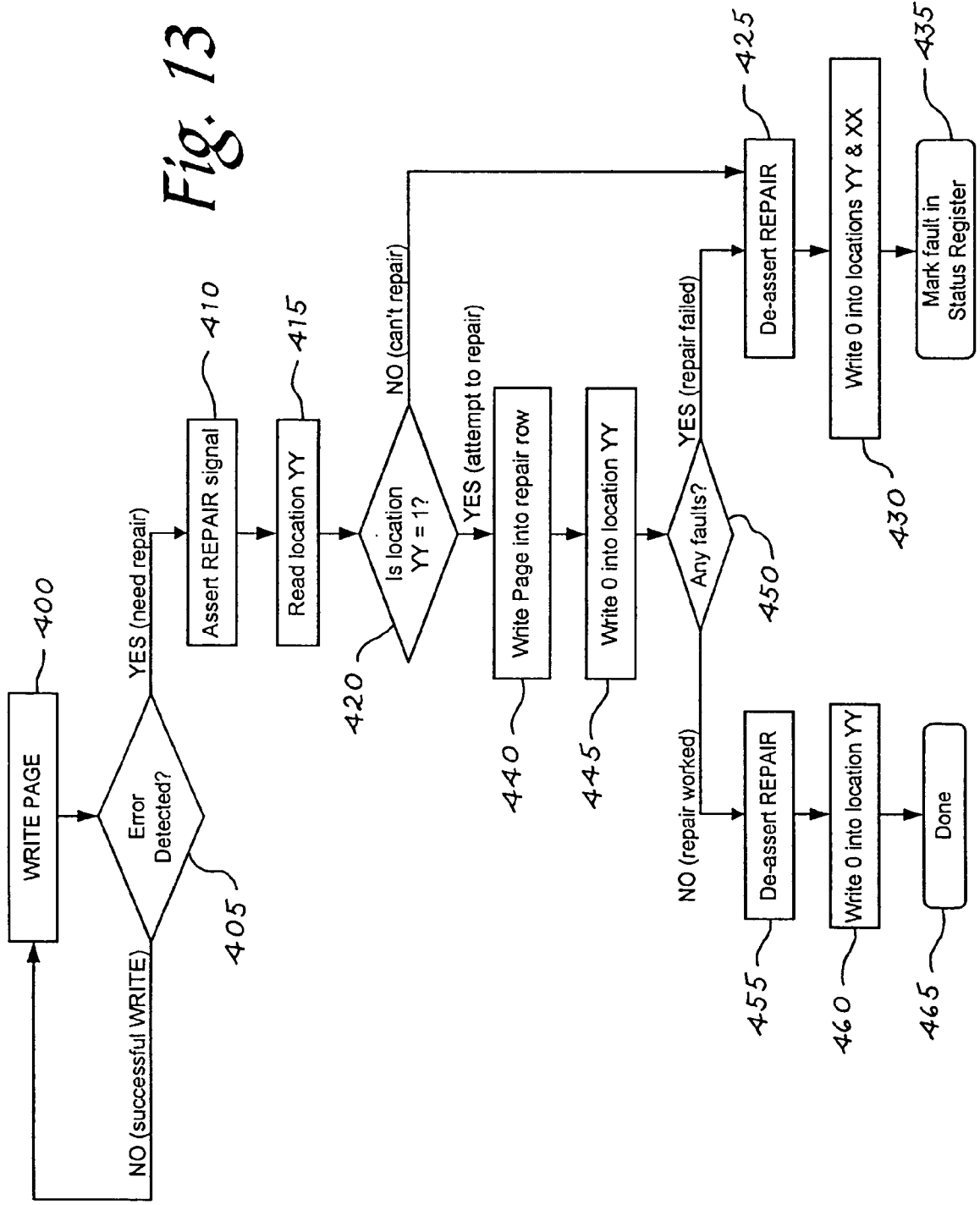
FIG. 13 is a flow chart illustrating a write operation of a preferred embodiment.

A write operation will now be illustrated in conjunction with FIG. 13. With reference to FIG. 13, an attempt is first made to write a page to the memory array 150 (act 400), and a determination is made regarding whether an error has been detected (act 405). In this preferred embodiment, an ECC scheme that can correct a single-bit error protects individual oct-bytes in a page, and an error is detected when more than one bit in a given oct-byte cannot be written into the memory array 150 as intended. If the bit sprinkling feature is used, it is preferred that the error reporting mechanism keep track of errors in all tiles in parallel since each eight-bit written entity comprises bits from eight different oct-bytes. To support this functionality, it is preferred that a 72×8 memory array be used, where a group of eight rows (out of the 72 rows) represents one of the bays, where each row in the group of eight rows represents an oct-byte boundary for the tile, and where there is a column for each of the eight bits in the written entity. In this preferred embodiment, faults occurring within the spare array are not tracked with this scheme due to the complexity of the operation across scrambled data. Instead, a simple double-fault detection scheme is preferably deployed for the spare array, where any two write errors within the same spare array boundary will trigger a write fault. Such a detection scheme is adequate given that the spare array contains only two oct-bytes per page.

If an error is detected, the write operation continues until the entire page is written, and then the repair signal is asserted (act 410). In this preferred embodiment, an error in writing two or more bits in a given oct-byte triggers the replacement of the entire page comprising that oct-byte. Before attempting the replacement, the memory device 100 reads location YY in the redundant block (act 415) and determines if location YY is programmed (act 420). This determines whether the targeted redundancy location is already occupied. If the targeted redundancy location is already occupied, the page cannot be repaired, and the repair signal is de-asserted (act 425). Locations XX and YY in the original location are then programmed with 0s to indicate that a repair was attempted but failed (act 430). The fault is also marked in the status register 170 (act 435). If the targeted redundancy location is not already occupied, the page is written into the repair row (act 440), and a 0 is written in location YY to mark the redundancy location as being occupied (act 445). Next, it is determined whether a fault occurred in writing the page to the repair row (act 450). If a fault was detected, the repair failed, and acts 425–435 are performed as described above. However, if a fault was not detected, the repair was a success, and the repair signal is de-asserted (act 455). A 0 is written into location YY of the primary block to indicate that the repair was attempted and completed, and the write operation ends (act 465).

As mentioned above, the memory device 100 can provide partial page write functionality. During a partial page write, an entire page is written to memory, but the unused sections of the page are padded with 1s. In this way, one can write, for example, the first 60% of a full page with one page write command and then write the remaining 40% of the page with a second page write command. In the presently preferred implementation, when a page is written, no indication is provided regarding whether the page is a partial page write or a full page write. Accordingly, every write operation is preferably treated as a partial page write. The redundancy/self-repair feature, however, preferably recognizes that a fault occurring during a partial page write will require transferring the entire page to the redundancy area. To accomplish this, the following two features are preferably added to the method illustrated in FIG. 13. First, before any partial page write, locations YY and XX are read to see if the page was repaired before. If so, the write operation preferably continues in the redundancy area. If not, the operation preferably operates as a regular write. Second, if there is a fault during the partial page write, the existing page information is preferably captured first and then written back into the redundancy area along with the original data.

Figure 14:
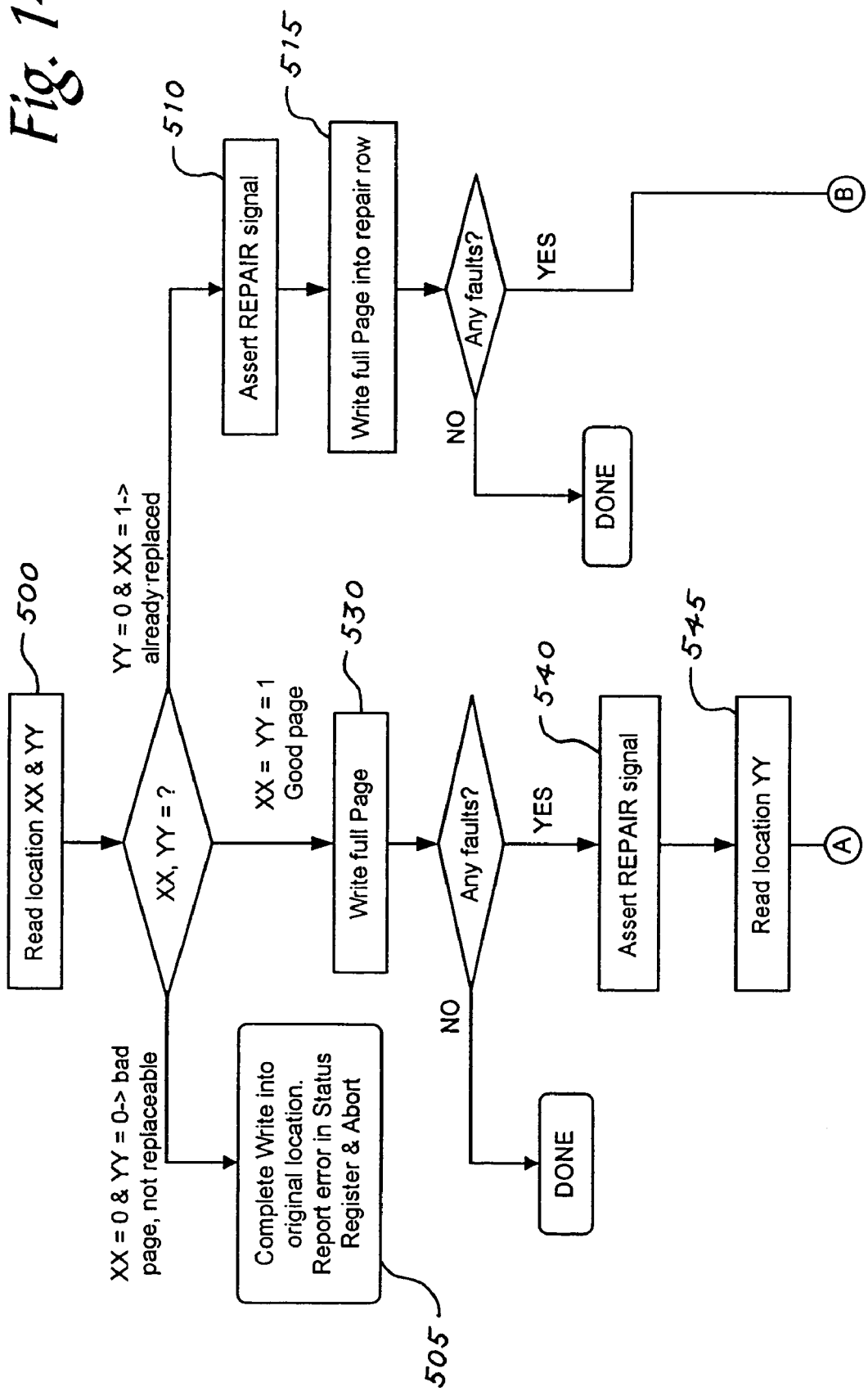
FIG. 14 is a flow chart illustrating a write operation of another preferred embodiment.
Figure 14:
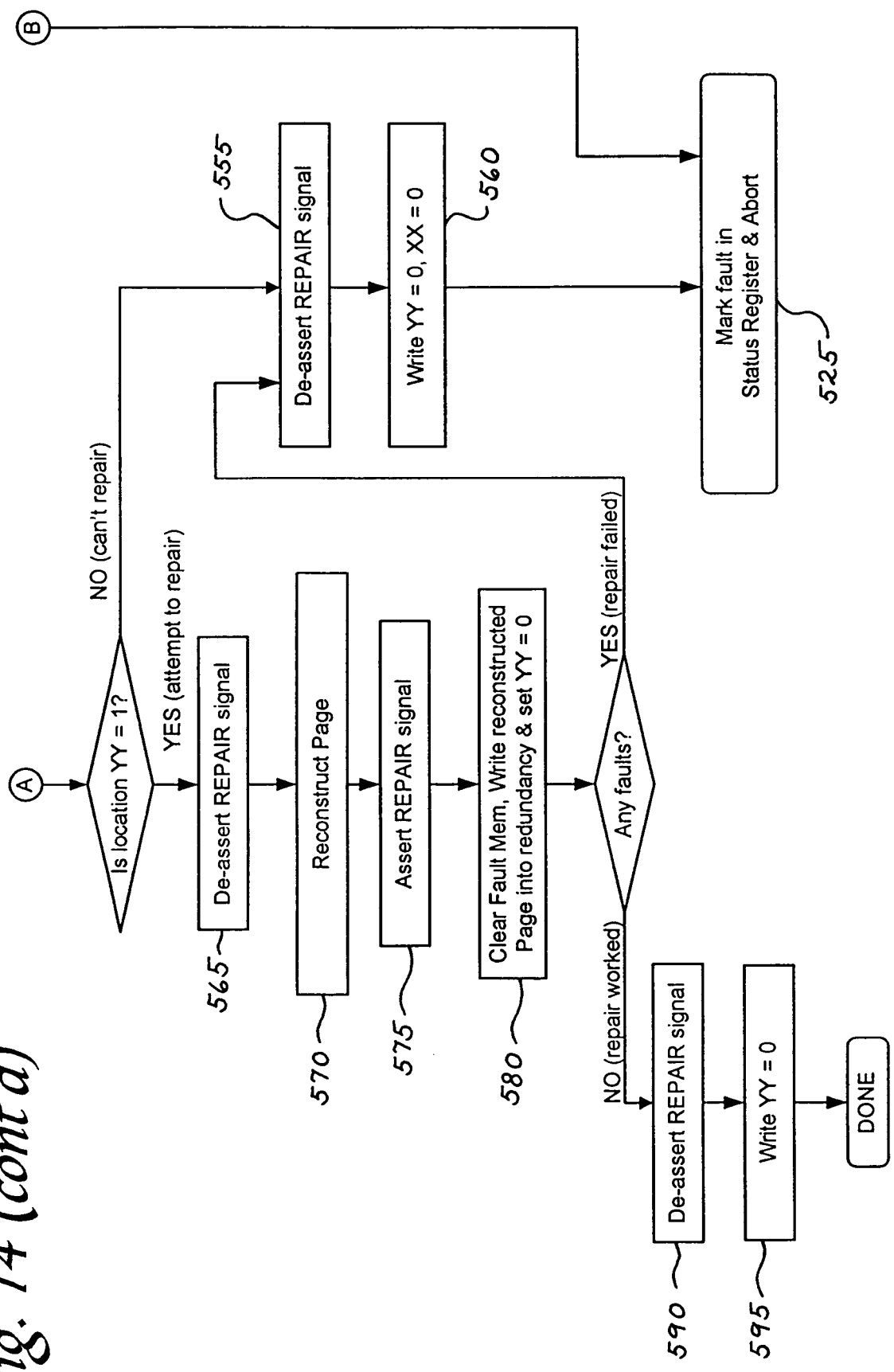

FIG. 14 is a flowchart illustrating a write operation with these modifications. Before a write operation is performed, locations XX and YY in the primary block are read (act 500). If XX and YY both contain 0s, the page is bad and cannot be replaced. The write operation is completed in the original location, the error is reported in the status register 170, and the write operation is aborted (act 505). If YY contains a 0 and XX contains a 1, the page is already in the redundancy area, and the write operation should be performed in that space. In this situation, the repair signal is asserted (act 510), and the full page is written into the repair row (act 515). If no fault occurs, the write was successful. However, if a fault occurs, the fault is marked in the status register 170, and the write operation is aborted (act 525). In this preferred embodiment, a fault in the redundancy area cannot be fixed. In an alternate embodiment, faults in the redundancy area are fixable. For example, additional redundant blocks can be allocated to replace faulty redundant blocks.

If XX and YY both contain 1s, the page is good, and a full page write is performed (act 530). If no fault occurs, the write operation is a success, as is expected for most write operations. However, if a fault occurs, the repair signal is asserted (act 540), and location YY in the redundant block is read (act 550). If location YY stores a 0, a repair is not possible since the redundant block is already occupied. The repair signal is de-asserted (act 555), 0s are written in the YY and XX locations of the primary block (act 560), and the fault is marked in the status register 170 (act 525). In this preferred embodiment, if a partial page is being written when a fault occurs, it is preferred that the entire page be moved with the previously-written sections to the spare location. Accordingly, if location YY stores a 1, a repair attempt is possible, the repair signal is de-asserted (act 565), and the page is reconstructed (act 570). The mechanism to reconstruct pages relies on the following assumptions. One, all unwritten (virgin) bits in the memory are guaranteed to be at a Logic 1 state. Two, during a write operation, a 0 will never be accidentally written into a cell that is supposed to remain virgin. Three, errors reported during a write operation indicate that the memory device was unable to program a 0 into the memory array 150. Four, during a partial-page write, the page register 140 will contain the data for the section of the page (some multiple of oct-bytes), and the rest of the page will be padded with 1s. Given these assumptions, a new page can be reconstructed by a simple AND operation between the contents of the memory and the page register 140. As the ECC syndrome bits are self-contained in the existing portion of the page, ECC does not have to be recomputed for the newly-constructed page. Furthermore, the page can be reconstructed in the page register 140 itself without the need for additional storage space if the page register 140 has separate read and write ports.

After the page is reconstructed, the repair signal is asserted (act 575), and the reconstructed page is written into the redundancy area (act 580). During this time, location YY in the redundant block is set to 0, and the fault memory is cleared. (The fault memory is used to transfer the contents of the current page into the redundancy area. This memory can be physically mapped into the existing data register at the expense of some control logic.) If a fault occurs in writing the reconstructed page into the redundancy area, the repair fails, and acts 555, 560, and 525 are performed as described above. However, if no faults occur, the repair was successful. The repair signal is de-asserted (act 590), and 0 is stored in location YY of the primary block (act 595).

There are several advantages associated with these preferred embodiments. For example, the preferred embodiments can be used in non-volatile memories (write-once or write-many memories such as Flash, MRAM, FRAM, and organic polymer diodes) to improve yield due to failures that happen after the part ships as well as to reduce test costs. Reduction of test cost can be particularly important as the bit costs reduce in comparison to the test costs. Additionally, "on-the-fly" redundancy/self-repair increases the yield of a memory array when combined with ECC. Consider, for example, the situation in which the block size is one oct-byte and the target number of defects per million (dpm) memory arrays for a 64 MB memory is 50. By allocating eight bits of ECC for every 64 bits of data to protect for single-bit failures (a 12.5% overhead), the number of single-bit defects that can be allowed per chip is about 28.3. However, if ECC were combined with on-the-fly redundancy with direct mapping of 1,000 oct-bytes to one redundant oct-byte, the number of defects per chip is increased to about 1,423. Accordingly, a factor of 50 improvement in defects per chip is achieved with an overhead of one bit per 72 bits (a 1.4% overhead) and an extra oct-byte (a 0.1% overhead).

There are several alternatives that can be used with these preferred embodiments. For example, in the preferred embodiments described above, the redundancy feature was used to provide "on-the-fly" self-repair when field programming a memory array. In an alternate embodiment, the redundancy feature can be used when testing the memory array either at the factory or in the field. The redundancy/self-repair feature can be implemented as part of a testing apparatus, can be combined with other test features, or can be used by itself as a built-in self-test ("BIST") structure. In the BIST implementation, the memory device can perform simple logic cycling through the address space of the memory array and test the test columns. Upon detection of an error, the self-repair feature can automatically mark the faulty block of memory cells and provide a redundant block in the redundancy area of the memory array. In operation, in response to an error in writing test bits in the primary block, a flag is stored in a set of memory cells allocated to that primary block. Later, when a command is received to write to the primary block, the set of memory cells allocated to the primary block is read. In response to reading the flag stored in the set of memory cells, the memory device writes to the redundant block.

In another alternate embodiment, ECC bits are from different word lines, and the self-repair replacement block are from different bit lines. In yet another alternate embodiment, instead of implementing the ECC functionality as a hardware component in the memory device, the ECC functionality can be implemented as a hardware and/or software component in the host device. Additionally, the ECC functionality can be distributed between the memory device and the host device. Further, the preferred embodiments can be used without ECC or other error protection schemes. Also, the flag bit(s) can have a multi-bit parity coding that is suitable for write-once memories. This allows the parity to work even after new bits are programmed.

These preferred embodiments can be implemented with any suitable memory device, such as a solid-state memory device (i e., a memory device that responds to electrical read and write signals to cause digital information to be read from and stored in a memory array of the device), a magnetic storage device (such as a hard drive), or an optical storage device (such as a CD or DVD). The memory array can comprise write-once or write-many volatile or non-volatile memory cells. Although any suitable type of memory cell can be used, in one preferred embodiment, the memory cell comprises an anti-fuse and a diode. The memory array can be made from any suitable material. In one preferred embodiment, the memory array comprises a semiconductor material. Other materials can be used, such as, but not limited to, phase-change materials and amorphous solids as well as those used with MRAM and organic passive element arrays, as described in U.S. Pat. No. 6,055,180, which is hereby incorporated by reference.

The memory array can comprise a two-dimensional or three-dimensional memory array of memory cells. In one preferred embodiment, the memory device takes the form of a solid-state memory device having a three-dimensional memory array of vertically-stacked field-programmable memory cells, as described in U.S. Pat. No. 6,034,882 to Johnson et al., U.S. Pat. No. 5,835,396 to Zhang, and U.S. patent application Ser. No. 09/560,626, all of which are hereby incorporated by reference. As discussed in those documents, three-dimensional memory arrays provide important economies in terms of reduced size and associated reductions in manufacturing cost. It is important to note that the following claims should not be read as requiring a specific type of memory device (e.g., write-once or write-many) or specific type of memory array (e.g., two dimensional or three-dimensional) unless explicitly recited therein.

In one embodiment, a memory device comprising a three-dimensional memory array comprises redundancy circuitry. The term "redundancy circuitry" is intended to broadly refer to any structure that is operative to write to a redundant block in response to an error in writing to a primary block of the memory array. Redundancy circuitry can perform additional functions. For example, redundancy circuitry can be used in read operations. While redundancy circuitry can be designed to store a flag in a set of memory cells allocated to the primary block or as a redundancy address matching circuit, redundancy circuitry can take other forms and should not be limited to the redundancy features described herein.

In one preferred embodiment, the memory device takes the form of a modular, compact, handheld unit, such as a memory card or stick, that comprises an external electrical connector that can be coupled with a host device, such as a digital camera, digital audio player, or other portable consumer product.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for providing redundancy when field programming a memory array, the method comprising:
   (a) providing a memory array comprising a primary block of memory cells and a redundant block of memory cells;
   (b) attempting to field program the primary block with data;
   (c) detecting an error in field programming the primary block with the data; and
   (d) in response to detecting the error:
      (d1) field programming a flag in a set of memory cells allocated to the primary block, wherein the set of memory cells is in the memory array; and
      (d2) field programming the redundant block with the data;
   wherein the flag indicates that the redundant block should be read instead of the primary block to read the data.

2. The invention of claim 1 further comprising:
   (e) in response to a command to read the primary block, reading the set of memory cells allocated to the primary block; and
   (f) in response to reading the flag stored in the set of memory cells allocated to the primary block, reading the redundant block.

3. The invention of claim 1, wherein the primary block comprises a plurality of smaller blocks, and wherein the error in field programming the primary block occurs when there is an error in field programming at least one bit in one of the smaller blocks.

4. The invention of claim 3, wherein the smaller block comprises an oct-byte and the primary block comprises a page.

5. The invention of claim 1, wherein the error occurs when there is an error in field programming a single bit.

6. The invention of claim 1, wherein the error occurs when there is an error in field programming two bits.

7. The invention of claim 1, wherein the error occurs when there is an error in field programming X bits, wherein X is sufficient to introduce an error that is uncorrectable by an error protection scheme protecting at least some of the memory cells in the primary block.

8. The invention of claim 1, wherein (c) comprises:
   attempting to program a memory cell in the primary block; and
   while attempting to field program the memory cell, determining that the memory cell is not in a programmed state.

9. The invention of claim 1, wherein (c) comprises:
attempting to field program a memory cell in the primary block;
reading the memory cell after the attempt to field program the memory cell; and
determining that the memory cell is not in a programmed state.

10. The invention of claim 1, wherein the primary block is associated with the redundant block via direct mapping.

11. The invention of claim 1, wherein the primary block is associated with the redundant block via set-associative mapping.

12. The invention of claim 1, wherein the primary block is associated with the redundant block via fully-associative mapping.

13. The invention of claim 1, wherein the memory array comprises write-once memory cells.

14. The invention of claim 1, wherein the memory array comprises a three-dimensional memory array of vertically-stacked field-programmable memory cells.

15. The invention of claim 1, wherein the memory array comprises a semiconductor material.

16. The invention of claim 1, wherein (b) is performed by a memory device comprising the memory array.

17. The invention of claim 1, wherein (b) is performed by a host device coupled with a memory device comprising the memory array.

18. A method for providing redundancy when field programming a memory array, the method comprising:
    (a) providing a memory array comprising a primary block of memory cells and a redundant block of memory cells;
    (b) attempting to field program the primary block with data;
    (c) while attempting to field program the primary block with the data, determining that an error occurred in field programming the primary block with the data; and
    (d) field programming the redundant block with the data.

19. The invention of claim 18 further comprising:
storing a flag in a set of memory cells allocated to the primary block in response to the error in field programming the primary block.

20. The invention of claim 19, wherein the flag is stored by a memory device comprising the memory array.

21. The invention of claim 19, wherein the flag is stored by a host device coupled with a memory device comprising the memory array.

22. The invention of claim 19 further comprising:
in response to a command to read the primary block, reading the set of memory cells allocated to the primary block; and
in response to reading the flag stored in the set of memory cells allocated to the primary block, reading the redundant block.

23. The invention of claim 18, wherein the primary block is associated with the redundant block via direct mapping.

24. The invention of claim 18, wherein the primary block is associated with the redundant block via set-associative mapping.

25. The invention of claim 18, wherein the primary block is associated with the redundant block via fully-associative mapping.

26. The invention of claim 18 further comprising:
storing an address of the primary block in a redundancy address matching circuit.

27. The invention of claim 26 further comprising in response to a command to read the primary block:
determining that the address of the primary block is stored the redundancy address matching circuit; and
reading the redundant block.

28. The invention of claim 18, wherein the primary block comprises a plurality of smaller blocks, and wherein the error field programming the primary block occurs when there is an error in field programming at least one bit in one of the smaller blocks.

29. The invention of claim 28, wherein the smaller block comprises an oct-byte and the primary block comprises a page.

30. The invention of claim 18, wherein the error occurs when there is an error in field programming a single bit.

31. The invention of claim 18, wherein the error occurs when there is an error in field programming two bits.

32. The invention of claim 18, wherein the error occurs when there is an error in field programming X bits, wherein X is sufficient to introduce an error that is uncorrectable by an error protection scheme protecting at least some of the memory cells in the primary block.

33. The invention of claim 18, wherein the memory array comprises write-once memory cells.

34. The invention of claim 18, wherein the memory array comprises a three-dimensional memory array of vertically-stacked field-programmable memory cells.

35. The invention of claim 18, wherein the memory array comprises a semiconductor material.

36. A memory device comprising:
a three-dimensional memory array of vertically-stacked field-programmable memory cells, the memory array comprising a primary block of memory cells and a redundant block of memory cells; and
redundancy circuitry operative to field program the redundant block in response to an error in field programming the primary block.

37. The invention of claim 36, wherein the redundancy circuitry is operative to, in response to an error in field programming the primary block, store a flag in a set of memory cells allocated to the primary block.

38. The invention of claim 37, wherein the redundancy circuitry is further operative to, in response to a command to read the primary block, read the set of memory cells allocated to the primary block; and, in response to reading the flag stored in the set of memory cells allocated to the primary block, read the redundant block.

39. The invention of claim 37, wherein the redundancy circuitry comprises a redundancy address matching circuit.

40. The invention of claim 36 further comprising write circuitry operative to attempt to field program a memory cell in the primary block and, while attempting to field program the memory cell, determine that the error occurred in field programming the primary block.

41. The invention of claim 36 further comprising write circuitry operative to attempt to field program a memory cell in the primary block, read the memory cell after the attempt to field program the memory cell, and determine that the error occurred in field programming the primary block.

42. The invention of claim 36, wherein the memory array comprises write-once memory cells.

43. The invention of claim 36, wherein the memory array comprises a semiconductor material.

* * * * *